United States Patent [19]

Navarro et al.

[11] 4,251,754
[45] Feb. 17, 1981

[54] DIGITAL OSCILLOSCOPE WITH REDUCED JITTER DUE TO SAMPLE UNCERTAINTY

[75] Inventors: Luis J. Navarro; Thomas P. Dagostino, both of Beaverton, Oreg.

[73] Assignee: Tektronix, Inc., Beaverton, Oreg.

[21] Appl. No.: 71,815

[22] Filed: Sep. 4, 1979

[51] Int. Cl.³ ............................................. H01J 29/56
[52] U.S. Cl. ..................................... 315/370; 315/367
[58] Field of Search ...................... 315/370, 371, 367; 340/791, 792; 358/36, 51

[56] References Cited

U.S. PATENT DOCUMENTS 4,107,739 8/1978 Rossi et al. .............................. 358/36

*Primary Examiner*—Theodore M. Blum
*Attorney, Agent, or Firm*—George T. Noe

[57] ABSTRACT

Jitter due to sample uncertainty in a digital oscilloscope is reduced by horizontally shifting each frame of a repetitive waveform display to provide an apparent time coincidence of each frame. The time interval between a fixed point on the successive waveforms and the next succeeding clock edge is measured, and a correction voltage is produced to offset the sweep voltage by the corrected amount.

9 Claims, 6 Drawing Figures

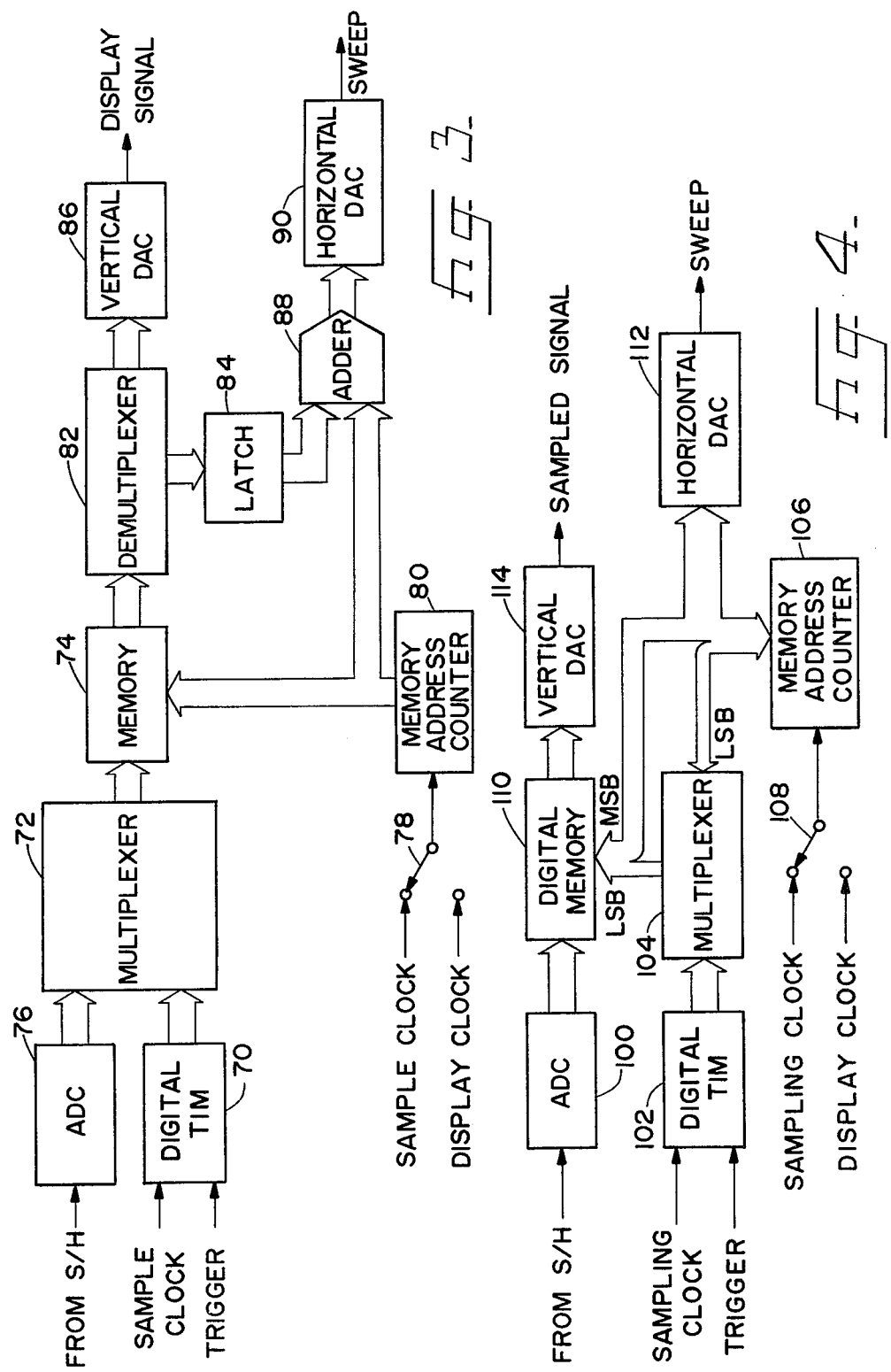

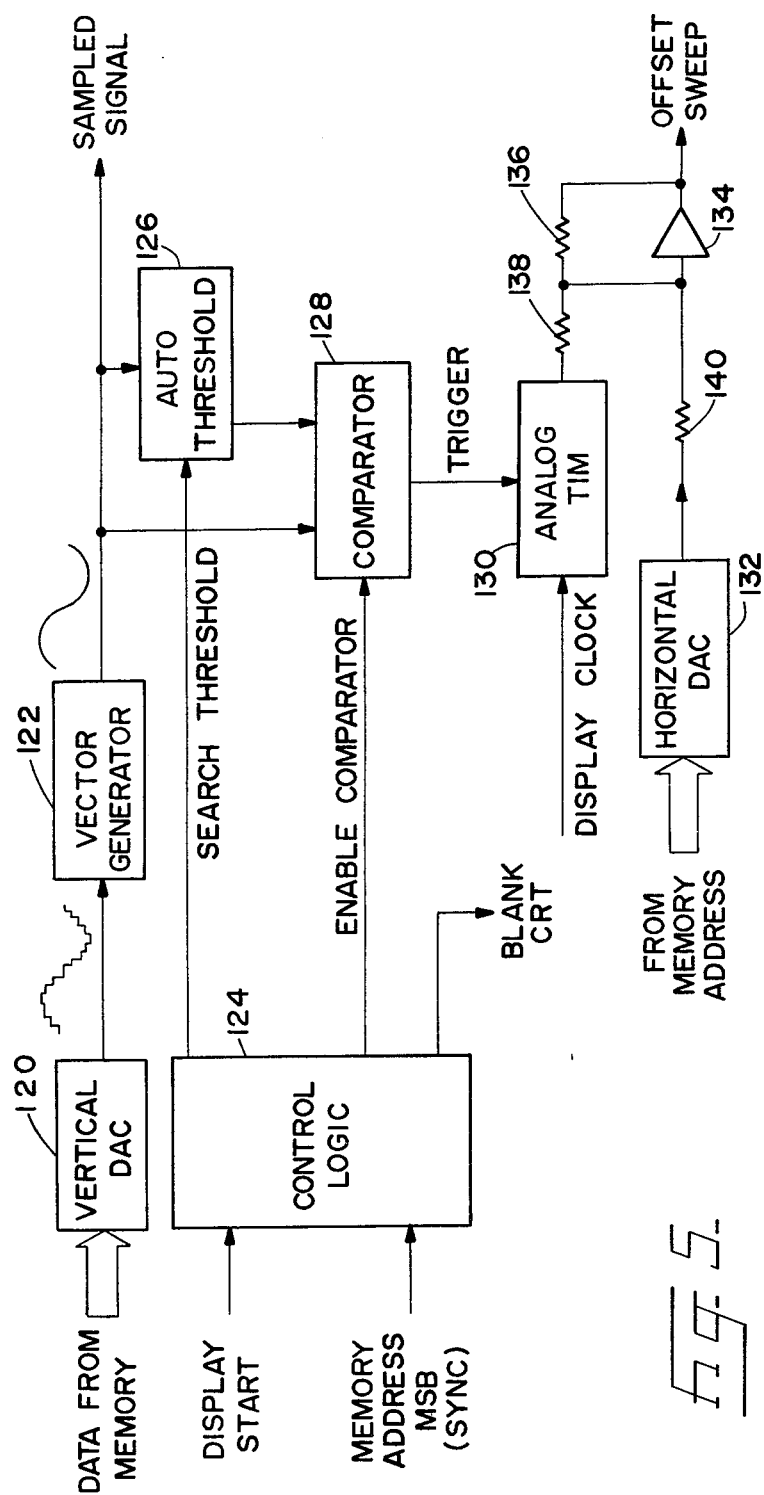

DIGITAL OSCILLOSCOPE WITH REDUCED JITTER DUE TO SAMPLE UNCERTAINTY

BACKGROUND OF THE INVENTION

Conventional digital oscilloscopes acquire, record, and display amplitude vs. time waveforms. Samples of an input signal are taken and quantized, and the resultant digital representations are stored in a memory under the control of a sampling clock. The data thus acquired is subsequently clocked out of memory and converted to an analog replica under the control of a display clock. The sampling clock may be operated at one of several selectable rates, depending upon the frequency content of the input signal.

A problem arises in repetitive-waveform acquisition/display systems in that the triggering point, which is the same on each successive waveform, and the sample clock, which operates at a predetermined fixed rate, are not correlated. Unlike a conventional analog oscilloscope wherein an event-related trigger initiates a time-base sweep, the display in a digital oscilloscope begins on a clock signal. Since the trigger point on a waveform may fall anywhere between two successive sample clock pulses, there exists an uncertainty of ± one-half sample interval with respect to the trigger point. In terms of a repetitive-frame display, the sample uncertainty is manifested as horizontal jitter of the waveform of ± one-half sample clock period. The observable jitter may vary from barely discernible to intolerable, depending upon the various clock and signal rates involved. As a rule, however, the observable jitter increases as the sample density, i.e., number of samples per cycle, is decreased. For example, assuming a display time-base length of 10 scale divisions, repetitive waveforms sampled at a 5-megahertz rate (200 nano-second sample clock period) and subsequently displayed at the equivalent of 20-nanosecond per division rate will have horizontal jitter of ± one-half division, or one full division overall, thereby rendering such a display unitelligible as far as any time measurement is concerned.

SUMMARY OF THE INVENTION

According to a preferred embodiment of the present invention, jitter due to sample uncertainty in a waveform acquisition system is reduced by horizontally shifting each frame of a repetitive waveform display to provide apparent time coincidence of each frame. This is achieved by measuring the time interval between a fixed point on the successive waveforms and the next succeeding sample clock pulse, generating an offset current proportional to the time interval measured, and injecting the offset current into the sweep generator output to horizontally shift the entire display by the appropriate amount of each frame.

A time interval meter is utilized to measure the time from trigger occurrence to the edge of the sampling clock pulse which causes the sample to be taken. The time thus measured varies from frame to frame, and the measurement is utilized to offset the respective sweeps for each frame as discussed above. The time interval measurements may also be stored in memory along with the respective waveform samples for later playback and conversion to a sweep offset current.

Other embodiments include triggering upon a subsequent reconstructed analog waveform in the manner of a conventional triggered oscilloscope and making a time interval measurement between a subsequently generated trigger and a display clock edge to produce the required offset current.

It is therefore one object of the present invention to provide a novel method and apparatus for reducing jitter due to sample uncertainty.

It is another object to provide a method and apparatus which eliminates jitter by detecting the offset of each frame and horizontally shifting the display to correct for the offset.

It is a further object to provide a repetitive waveform acquisition and display system wherein the waveform may be acquired by fewer samples per waveform cycle by building up the waveform over several acquisition cycles.

It is an additional object to provide an acquisition and display system to correct for ± one-half sample uncertainty where the sampling clock and input signal are uncorrelated.

Other objects and attainments of the present invention will become apparent to those skilled in the art upon a reading of the following detailed description when taken in conjunction with the drawings.

DRAWINGS

FIG. 3 is a block diagram of an acquisition-and-display circuit in which jitter correction data is stored along with waveform date;

FIG. 4 is a block diagram of an embodiment of an acquisition-and-display circuit in which jitter is corrected by shifting the address locations for each frame; and FIG. 5 is a block diagram of the display portion of an alternative embodiment of an acquisition-and-display circuit.

DETAILED DESCRIPTION OF THE INVENTION

Figure 1A:
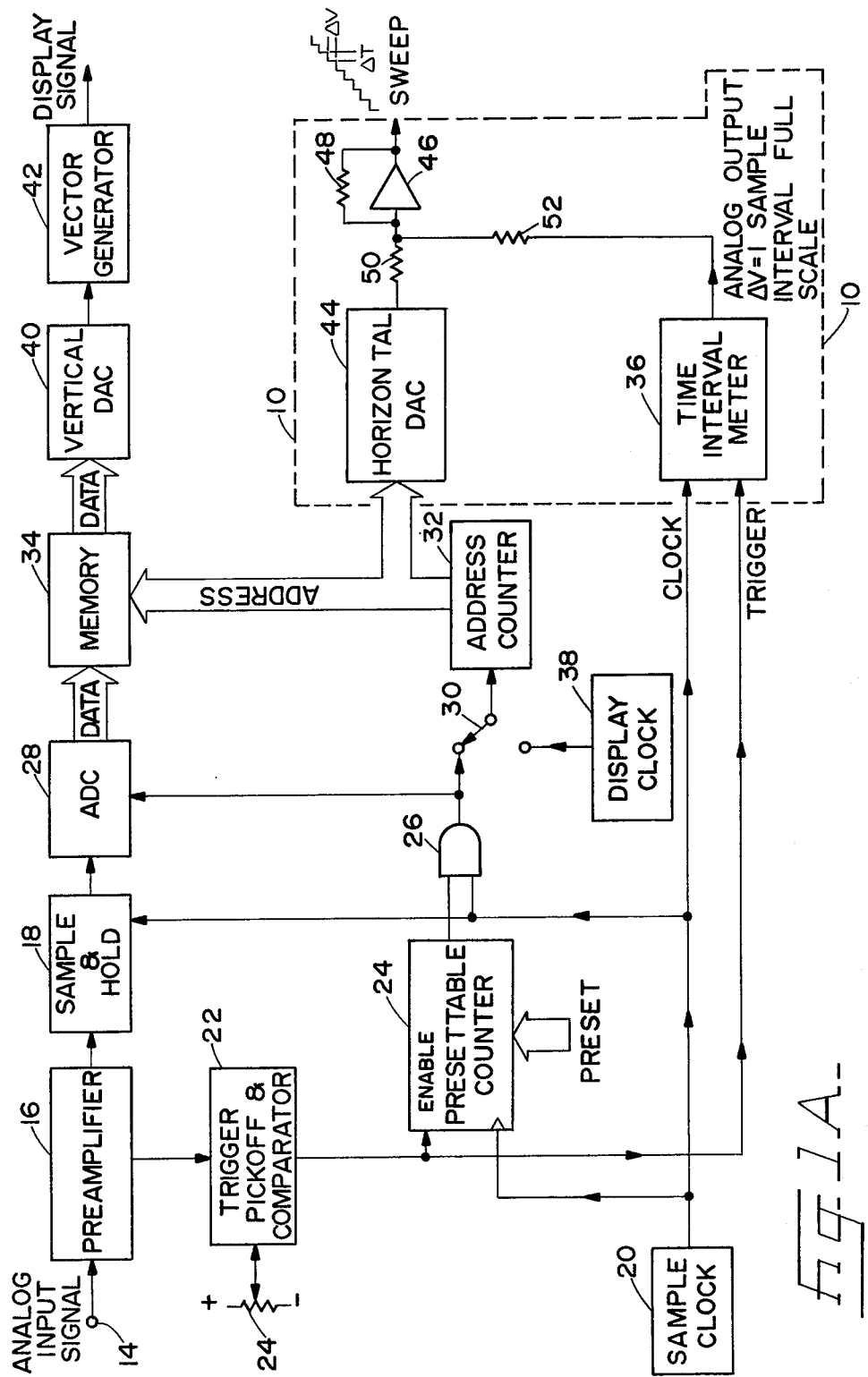
FIG. 1A is a block diagram of a waveform acquisition and display system employing a jitter correction circuit in accordance with the present invention.

Referring to the block diagram of FIG. 1A, a block diagram is shown of a largely conventional waveform acquisition and display system employing a jitter correction circuit 10 generally enclosed by a dashed line. An analog signal is applied via an input terminal 14 to a preamplifier 16, which may suitably be a conventional gain switching amplifier for amplifying or attenuating the input signal to a suitable level. The preamplified analog signal is then applied to a sample-and-hold circuit 18, which takes samples of instantaneous values of the analog signal at evenly spaced intervals determined by a sample clock 20. In a proposed commercial embodiment, the sample clock produces sample clock pulses at a selectable rate between 10 Hertz and 25 Megahertz.

The analog signal is also applied to a trigger pickoff and comparator circuit 22, which generates a trigger signal at a point on the analog signal determined by a trigger level potentiometer 24. The trigger signal is applied to the Enable input of a presettable counter 24, which may be preset to provide pre-triggered or post-triggered operation in the conventional manner. Sample clock pulses are applied to the clock input of te presettable counter. An AND gate 26 passes a predetermined number of clock pulses in accordance with the output of the presettable counter 24. The clock pulses from AND gate 26 are applied simultaneously to an analog-to-digital converter (ADC) 28 and through the closed contacts of a switch 30 to an address counter 32. It should be noted that in actuality, switch 30 is an electronic switch. The ADC 28 converts the instantaneous amplitude samples taken by the sample-and-hold circuit 28 to n-bit digital data, which is then clocked into a memory 34 in accordance with addresses selected by the address counter 32.

Figure 2:
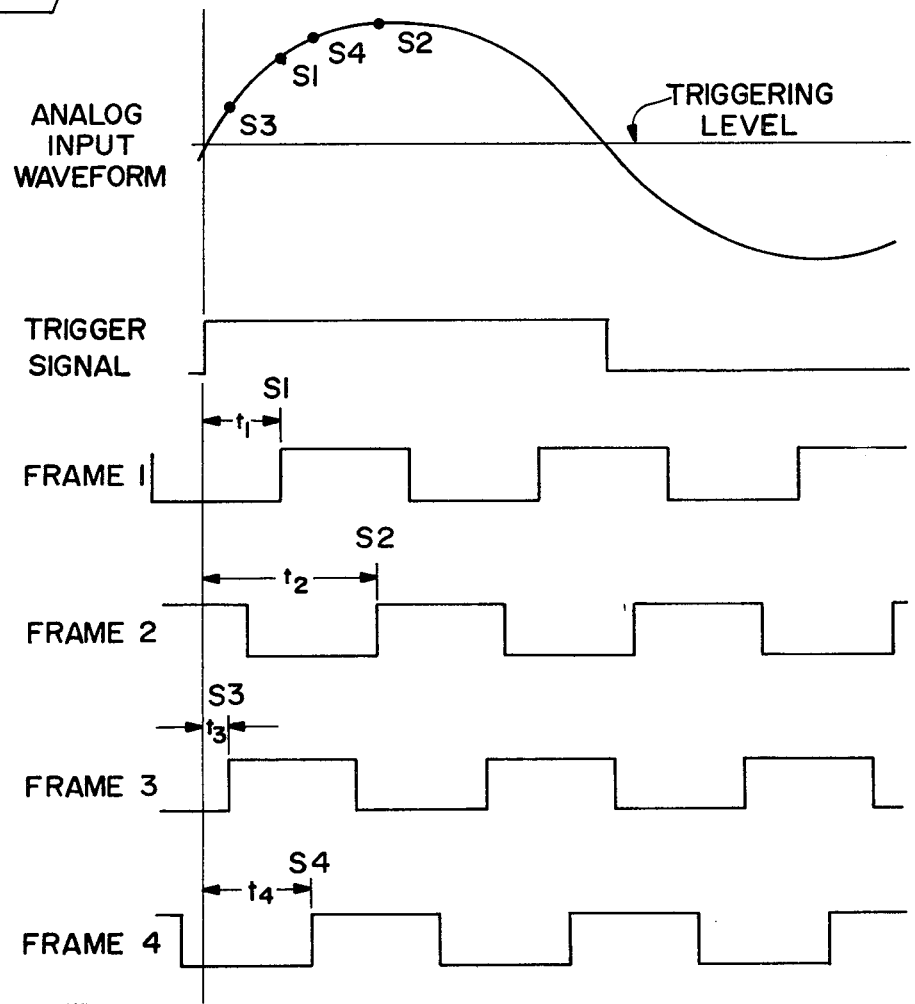
FIG. 2 is a waveform diagram showing the time interval measurement to correct for jitter.

At the appropriate timing event, the time interval is measured between the aforementioned trigger signal and the first sampling clock pulse occurring thereafter. In FIG. 2, the relationship between the analog input signal, the trigger signal, and the sampling clock signal is shown. Let us assume that the analog waveform is cyclic and that several frames are going to be acquired in order to provide a repetitive display. The trigger signal is related to the analog waveform because it is generated whenever the waveform passes through a predetermined and selectable trigger level. Hence, for each cycle of the waveform, the triggering occurs repetitiously at the same point on the waveform. The sample clock pulses, however, are not correlated with the waveform, and therefore the first sample may be taken at any random point within a sample clock period. Thus, the timing relationship of the sampling clock signal to the trigger signal for the four frames illustrated has been chosen arbitrarily within the clock period for purposes of explanation. For frame 1, the trigger signal enables counter 24, as mentioned previously, and on the next clock pulse a sample S1 is taken on the waveform. Similarly, for frames 2, 3, and 4, samples S2, S3, and S4 respectively are taken. To prevent the jitter that would occur by initiating the display for the successive frames at the time point of the first sample (S1, S2, S3, and S4 in this case), the time interval between the trigger signal and the first clock edge is measured by a time interval meter 36 in the jitter correction circuit 10 of FIG. 1A, and analog correction voltage proportional to the time interval is generated. This correction voltage is held until a new record is received to shift the entire display by the measured amount. To see this clearly, let us look at frame 1 in the display mode. At the initiation of acquisition of frame 1, the time interval $t_1$ is measured, and the correction voltage proportional to time $t_1$ is generated and held by the time interval meter 36. After the entire waveform for frame 1 has been acquired, the switch 30 is moved to its lower position, connecting a display clock 38 to the address counter 32. The display clock 38 operates at a rate determined by the horizontal sweep rate so that all of the 512 stored samples will be clocked out of memory 34 during the display of one complete frame. The stored samples are applied to a DAC 40 and converted to analog data. A vector generator 42 may receive the converted analog data at the display rate and generate therefrom an analog display to be applied to the vertical deflection plates of an associated cathode-ray tube, or, the analog data may be applied directly to provide a dot display. Simultaneously with the display clocking of the memory, the address count signal is applied to a DAC 44 to generate a sweepdrive signal. An operational amplifier 46 including a feedback resistor 48 receives the sweep-driving signal via an input resistor 50 and the correction voltage via an input resistor 52 and provides a corrected sweep output signal to start the displayed analog signal at the corrected point. While a staircase voltage is shown, the sweep signal could just as well be a linear voltage ramp.

Likewise, for frame 2, time interval $t_2$ is measured and utilized to shift the display of the second frame a corrected amount so displayed frame 2 coincides with the position of corrected frame 1. Again, for frames 3 and 4, time intervals $t_3$ and $t_4$ are measured, and correction voltages generated. To the observer of a repetitive-frame display, the time position of the display signal is always the same, and hence, jitter is eliminated.

Figure 1B:
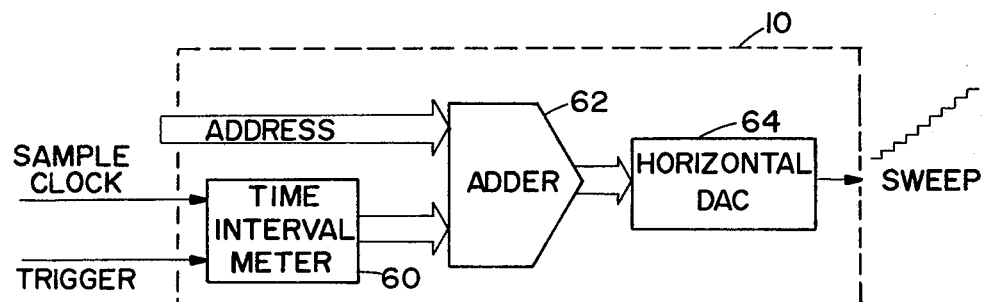
FIG. 1B is a block diagram of an alternative jitter correction circuit for use in the system of FIG. 1A.

FIG. 1B shows a digital implementation of the jitter correction circuit 10. Here, the time interval is measured by a time interval meter 60, and the digital output therefrom is added to the address count signal by an adder 62 in the display mode. The output from the adder is then applied to DAC 64, thereby generating a corrected sweep output. The implementation of time interval meters 36 and 60 in analog and digital forms respectively may take many forms, and such time-to-quantity conversion circuits are well known in the art.

FIG. 3 shows a block diagram of an acquisition-and-display circuit in which jitter correction data is stored along with waveform data. The correction data generated at the initiation of an acquisition cycle by a digital time interval meter 70 is applied via a multiplexer 72 to a memory 74, and stored in one memory location therein. The analog signal is converted to digital data by an ADC 76, and applied via multiplexer 72 to the remaining memory locations of memory 74. During the acquisition of one frame of the waveform, a sample clock signal is applied via a switch 78 to a memory address counter 80. For the display of the stored waveform, switch 78 is moved to its lower position, applying the display clock signal to the memory address counter 80. The stored correction data is clocked out of memory 74, applied via a demultiplexer 82 to a latch 84, where it is held for one complete frame. The stored waveform data is clocked out of memory 74 and applied via demultiplexer 82 to a DAC 86 to generate the analog display signal. Contemporaneously, the address counter output is added to the correction data by adder 88, and the corrected horizontal data is applied to a DAC 90 to generate the corrected sweep output. The cycle is repeated for each frame so that the corrected repetitive frames coincide, eliminating the sample clock uncertainty jitter.

FIG. 4 is a block diagram of an embodiment of an acquisition-and-display circuit in which jitter due to sample clock uncertainty is corrected by shifting address locations for each frame. Here, the sampled data is converted from analog to digital form by an ADC 100. The time interval between the trigger signal and sampling clock pulse is measured by a digital time interval meter 102, and the correction data is utilized by a multiplexer 104 to replace the least significant bit from an address counter 106, which counts sample clock pulses applied thereto via a switch 108. The corrected count signal is then applied during the acquisition cycle to a memory 110, which receives the waveform data from ADC 100. In the display mode, switch 108 is moved to its right-hand position so that the display clock pulses are applied to the address counter. In the display mode, the address count signal is applied to the memory 110, with the least significant bit thereof being routed through multiplexer 104, and to a horizontal DAC 112 to generate the sweep signal signal. Contemporaneously therewith, the clocked-out data is applied to a vertical DAC 114 to generate the sampled waveform signal.

FIG. 5 is a block diagram of the display portion of an alternative embodiment of an acquisition-and-display circuit wherein the jitter correction circuit is operated by measuring the time interval between a trigger signal derived from the reconstructed waveform and the next-occurring display clock edge. One frame of the waveform is acquired and stored in the usual manner. In the display mode, the associated memory is repetitiously scanned, and the clocked-out data is converted from digital to analog form by DAC 120. A vector generator 122 smooths the analog waveform, essential regenerating the stored waveform. When the display mode is initiated (and during acquisition, for that matter) the associated cathode-ray tube is blanked by the output of a control logic circuit 124 to prevent display until the appropriate jitter correction can be made for this particular frame. The control logic circuit 124 may suitably be a sequential state machine, that is, an arrangement of flip-flops to generate a sequence of control signals to activate an auto threshold circuit 126, a comparator 128, and unblank the cathode-ray tube.

The sequence begins upon receipt of a display start signal, which may be, for example, the same signal utilized to switch the input of the associated address counter from the sample clock to the display clock. Upon receipt of the display start signal, control logic circuit 124 generates a signal to activate the auto threshold circuit 126, causing it to search for a suitable level on the reconstructed waveform upon which to trigger. Auto threshold circuit 126 suitably may be one of the many automatic trigger circuits or peak-to-peak auto circuits utilized by conventional oscilloscopes. The auto threshold circuit may be conditioned to establish a triggering level on a prominent waveform feature, such as a fast rising or falling edge. The most significant bit of memory address count signal is applied to the control logic circuit 124 as a clock signal, the period of which is equal to one complete scan of the memory contents. Once the triggering threshold is established, perhaps after one or two scans of the memory, the search threshold signal is removed from the autothreshold circuit 126, and an enable signal is applied to comparator 128. On the next scan of the memory contents, a trigger signal is generated by comparator 128. An analog time interval meter 130 measures the time difference between the trigger signal and the next display clock edge and generates an analog correction voltage proportional thereto. Note that in this embodiment, the time interval measurement is made on display-biased signals rather than acquisition-based signals. The effect in eliminating jitter due to sampling clock uncertainty, however, is the same. On the next scan of the memory, control logic circuit 124 removes the blanking signal from the cathode-ray tube, and the memory address count signal is converted from digital to analog form by a DAC 132 to generate a sweep signal. An operational amplifier 134 including a feedback resistor 136 adds the correction voltage to the sweep signals applied to respective input resistors 138 and 140.

In summary, a digital oscilloscope with reduced jitter due to sample uncertainty is shown and described herein. It will therefore be appreciated that the aforementioned and other desirable objects have been achieved; however, it should be noted that the preferred and alternative embodiments shown and described herein are intended as merely illustrative and not as restrictive of the invention, and many changes and modifications thereof may occur to those skilled in the art.

We claim:

1. A jitter correction circuit for a digital oscilloscope, comprising:
   a source of clock pulses having a predetermined clock rate;
   means for providing repetitive frames of digital data representative of an analog input signal, said digital data being provided synchronously with said clock pulses;
   means for measuring the time difference between a fixed point on said analog signal and a successive clock pulse for each frame, and generating offset correction signals proportional thereto; and
   means for combining said correction signals with a horizontal drive signal to horizontally shift each frame by the measured value.

2. A jitter correction circuit in accordance with claim 1 wherein said means for providing repetitive frames includes means for generating a trigger signal substantially coincident with a selectable fixed point on said analog signal.

3. A jitter correction circuit in accordance with claim 2 wherein said means for measuring the time difference comprises an analog time interval measurement circuit responsive to said trigger signal and said successive clock pulse for generating an analog voltage proportional to the time interval therebetween.

4. A jitter correction circuit in accordance with claim 3 wherein said horizontal drive signal is a progressively increasing analog voltage and said means for combining said correction signals with said horizontal drive signal comprises an operational amplifier.

5. A jitter correction circuit in accordance with claim 2 wherein said means for measuring the time difference comprises a digital time interval measurement circuit responsive to said trigger signal and said successive clock pulse for producing a digital signal representative of the time interval therebetween.

6. A jitter correction circuit in accordance with claim 5 wherein said horizontal drive signal is a sequential digital signal, and said means for combining said correction signals with said horizontal drive signal comprises a digital adder circuit.

7. A jitter correction circuit in accordance with claim 2 wherein said means for providing repetitive frames comprises a vertical signal processing channel including a sample-hold circuit, an analog-to-digital converter, a memory, an address counter for addressing said memory, and a digital-to-analog converter.

8. A jitter correction circuit in accordance with claim 7 further including means for multiplexing said digital data and said offset correction signals for storage in said memory.

9. A jitter correction circuit in accordance with claim 7 further including means for multiplexing said offset correction signals with at least a portion of the address count signal from said address counter to shift the memory locations for each frame of stored digital data.

* * * * *

UNITED STATES PATENT AND TRADEMARK OFFICE
CERTIFICATE OF CORRECTION

PATENT NO. : 4,251,754
DATED : Feb. 17, 1981
INVENTOR(S) : Luis J. Navarro et al.

It is certified that error appears in the above-identified patent and that said Letters Patent are hereby corrected as shown below:

Col. 1, line 38, "20-nanosecond" should be --200-nanosecond--.

Col. 4, line 63, "right-hand" should be --lower--.

Col. 4, line 68, "signal signal" should be --signal--.

Col. 5, line 51, "biased" should be --based--.

Signed and Sealed this

Twenty-first Day of July 1981

[SEAL]

Attest:

Attesting Officer

GERALD J. MOSSINGHOFF

Commissioner of Patents and Trademarks